(12) United States Patent
Tubert et al.

(10) Patent No.: US 9,681,077 B2
(45) Date of Patent: Jun. 13, 2017

(54) DEVICE FOR TRANSFERRING PHOTOGENERATED CHARGES AT HIGH FREQUENCY AND APPLICATIONS

(75) Inventors: Cedric Tubert, Sassenage (FR); Francois Roy, Seyssins (FR); Pascal Mellot, Lans en Vercors (FR)

(73) Assignees: STMicroelectronics SA, Montrouge (FR); STMicroelectronics (Grenoble 2) SAS, Grenoble (FR)

( * ) Notice: Subject to any disclaimer, the term of this patent is extended or adjusted under 35 U.S.C. 154(b) by 432 days.

(21) Appl. No.: 13/546,882

(22) Filed: Jul. 11, 2012

(65) Prior Publication Data
US 2013/0015910 A1     Jan. 17, 2013

(30) Foreign Application Priority Data

Jul. 12, 2011 (FR) .................................... 11 56322

(51) Int. Cl.
*H01L 29/06* (2006.01)
*H04N 5/372* (2011.01)

(52) U.S. Cl.
CPC ............. *H04N 5/372* (2013.01); *H01L 29/06* (2013.01); *H01L 29/0603* (2013.01)

(58) Field of Classification Search
CPC ..... H04N 5/372; H01L 29/06; H01L 29/0603; H01L 31/102; H01L 21/763; H01L 31/02; H01L 27/108; H01L 29/76; H01L 29/94; H01L 31/119; H03K 3/01
USPC .... 250/208.1, 214.1, 214 R; 257/126, 183.1, 257/184, 214, 215, 218, 371
See application file for complete search history.

(56) References Cited

U.S. PATENT DOCUMENTS

| | | | | |
|---|---|---|---|---|
| 5,055,900 A | * | 10/1991 | Fossum ............. | H01L 27/14831 257/236 |
| 5,086,010 A | * | 2/1992 | Kimura ............. | H01L 27/14831 257/215 |
| 7,667,255 B2 | * | 2/2010 | Dyer ................... | H01L 27/1087 257/301 |
| 8,513,761 B2 | * | 8/2013 | Roy et al. ...................... | 257/452 |
| 2005/0051730 A1 | | 3/2005 | Kuijk et al. | |

(Continued)

OTHER PUBLICATIONS

Dalla Betta et al., "Design and Characterization of Current-Assisted Photonic Demodulators in 0.18-μ CMOS Technology," IEEE Transactions on Electron Devices 58(6): 1702-1709, 2011.

(Continued)

*Primary Examiner* — Georgia Y Epps
*Assistant Examiner* — Don Williams
(74) *Attorney, Agent, or Firm* — Seed IP Law Group LLP (57) ABSTRACT

A device for transferring charges photogenerated in a portion of a semiconductor layer delimited by at least two parallel trenches, each trench including, lengthwise, at least a first and a second conductive regions insulated from each other and from the semiconductor layer, including the repeating of a first step of biasing of the first conductive regions to a first voltage to form a volume accumulation of holes in the area of this portion located between the first regions, while the second conductive regions are biased to a second voltage greater than the first voltage, and of a second step of biasing of the first regions to the second voltage and of the second regions to the first voltage.

28 Claims, 4 Drawing Sheets

(56) References Cited

U.S. PATENT DOCUMENTS

| | | | | |
|---|---|---|---|---|
| 2007/0138544 A1* | 6/2007 | Hirler | ............ | H01L 29/407 257/330 |
| 2009/0266973 A1* | 10/2009 | Roy | ............ | H01L 27/1463 250/206 |
| 2011/0210418 A1* | 9/2011 | Esmark | ............ | 257/517 |
| 2011/0249158 A1* | 10/2011 | Hynecek | ............ | H01L 27/1461 348/277 |

OTHER PUBLICATIONS

Büittgen et al., "Demonstration of a Novel Drift Field Pixel Structure for the Demodulation of Modulated Light Waves with Application in Three-Dimensional Image Capture," SPIE-IS&T Electronic Imaging 5302: 9-20, 2004.

Gokturk et al., "A Time-Of-Flight Depth Sensor—System Description, Issues and Solutions," Proceedings of the 2004 IEEE Computer Society Conference on Computer Vision and Pattern Recognition Workshops 2004, 9 pages, 2004.

Kawahito et al., "A CMOS Time-of-Flight Range Image Sensor With Gates-on-Field-Oxide Structure," IEEE Sensors Journal 7(12): 1578-1586, 2007.

Nieuwenhove et al., "Novel Standard CMOS Detector using Majority Current for guiding Photo-Generated Electrons towards Detecting Junctions," Proceedings Symposium IEEE/LEOS Benelux Chapter: 229-232, 2005.

Ringbeck et al., "Multi-Dimensional Object Detection Using PMD Sensors," Sensor Magazine 40-42, 2006 (with English Machine Translation).

\* cited by examiner

DEVICE FOR TRANSFERRING PHOTOGENERATED CHARGES AT HIGH FREQUENCY AND APPLICATIONS

BACKGROUND

Technical Field

The present disclosure relates to the field of photonic demodulators (PMD) and, more specifically, to an integrated device enabling to transfer photogenerated charges alternately in two directions at very high frequency, capable of being used in photonic demodulation devices.

Description of the Related Art

Many techniques enabling to acquire three-dimensional (3D) images are known. Especially, the stereovision technique is known, which comprises performing two simultaneous acquisitions of a same scene from two distinct points. The processing of these two acquisitions provides information relative to the distance of the objects of the scene.

So-called "time of flight" (TOF), or again "indirect measurement" techniques, are also known, which provide correlating the time taken by a wave to travel to a predetermined object and back with the distance between the acquisition device and this object.

To implement this technique, various transceiver structures have been provided. The receivers used generally comprise a pixel array, each pixel detecting information relative to the distance of objects by implementing the so-called "time of flight" technique.

Figure 1:
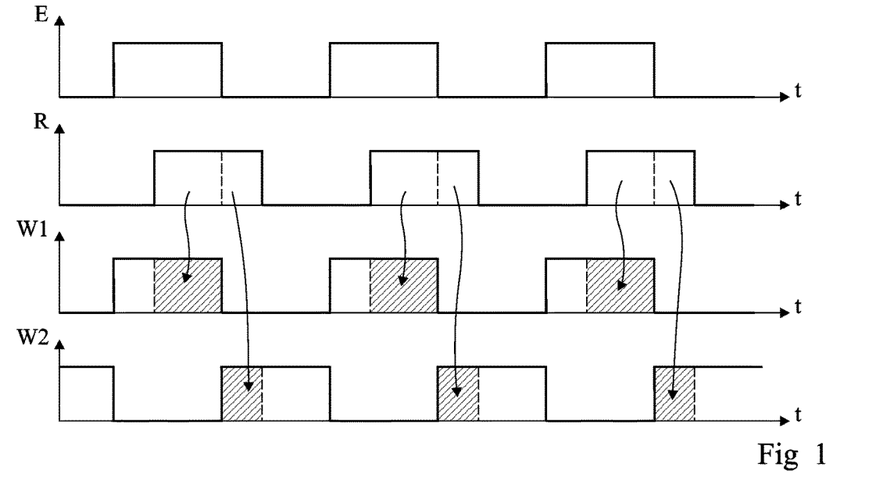
FIG. 1, previously described, shows timing diagrams illustrating a detection principle capable of being used to obtain three-dimensional images.

FIG. 1 shows timing diagrams illustrating a detection principle capable of being used in three-dimensional image sensors implementing the indirect measurement technique (TOF).

A wave transmission signal E is shown on a first curve, and signal R received by the device for detecting signal E is shown on a second curve. According to the distance between the transceiver and the detected object, and thus according to the time taken by the wave to travel to the object and back, and then to the receiver and back, signals E and R have a variable phase shift. To determine the distance to the object, two acquisition windows W1 and W2 are provided (illustrated by two other curves W1 and W2 in FIG. 1).

First acquisition window W1 is open (high state) when transmission signal E is in the high state. Second acquisition window W2 has the same width as window W1 and is shifted from W1 by a time period equal to the width of W1, that is, window W2 is open as soon as transmission signal E is in the low state.

It should be noted that, in practice, the rising edge of signal E cannot occur at the same time as the falling edge of window W2. A duty cycle between windows W1 and W2 different from 0.5 may for example be provided to decrease issues linked to the heat dissipation of light emitters (LED or laser).

Calling N1 and N2 the number of photogenerated electrons respectively collected in windows W1 and W2 after a large number of acquisition cycles, the distance between the detected object and the transceiver system may for example be determined by calculating the ratio of N2 to the sum of N1 and N2.

To obtain a high-quality photonic demodulation, a fast transfer of the data from the receive device to an electronic data processing circuit should be performed. Photogenerated charge transfer frequencies on the order of one gigahertz should be provided in order to obtain a fast image acquisition system (for example, in real time, for 3D video).

Further, the receive device should have a particularly high sensitivity. Currently, known image sensor devices do not enable an operation at high frequencies allowing a good detection sensitivity. This is due to the difficulty of transferring photogenerated charges at high speed with a good transfer efficiency.

This can also be explained by the fact that the wavelengths generally used to perform time-of-flight measurements, TOF, belong to the close infrared range, between 750 and 950 nm. Such waves have the disadvantage of generating, in silicon substrates used in image sensors, electron-hole pairs at significant depths. The transfer of such charges photogenerated deep in the substrate has a low efficiency, and even more when it is worked with planar structures (structures commonly used, currently, in CCD or CMOS technology, for example).

A device enabling to obtain a very high detection sensitivity compatible with the high frequencies for a high-quality photonic demodulation is thus desirable.

An alternated bidirectional charge transfer device having a good efficiency at high frequencies is also desirable.

BRIEF SUMMARY

One embodiment is a device for transferring photogenerated charges alternately in two directions, capable of operating at high frequencies for a high-quality photonic demodulation.

Some embodiments are various devices for processing the information provided by the above charge transfer device.

Thus, one embodiment provides a device for transferring charges photogenerated in a portion of a semiconductor layer delimited by at least two parallel trenches, each trench comprising, lengthwise, at least a first and a second conductive regions insulated from each other and from the semiconductor layer, comprising the repeating of a first step of biasing of the first conductive regions to a first voltage to form a volume accumulation of holes in the area of this portion located between the first regions, while the second conductive regions are biased to a second voltage greater than the first voltage, and of a second step of biasing of the first regions to the second voltage and of the second regions to the first voltage.

According to an embodiment, each trench comprises more than two insulated conductive regions, at least one central conductive region being biased, as the alternated bias steps are repeated, to a third constant voltage, between the first and the second voltage.

According to an embodiment, a first, respectively a second, transfer gate, located at the end of the portion on the side of the second, respectively the first, conductive regions is made conductive during the first, respectively the second, bias step.

According to an embodiment, the repeating of the bias steps alternately transfers the photogenerated charges towards a first and a second storage potential wells located at the ends of the portion.

According to an embodiment, more than two parallel trenches are provided, the first and second storage potential wells extending in front of the ends of the different areas forming the portion of the semiconductor layer.

According to an embodiment, the first and second storage potential wells are formed of multiple individual storage wells in front of the ends of the different areas.

According to an embodiment, the method further comprises a final step, after the repeating of the alternated bias steps, of transfer of the charges stored in the first and second storage wells to a device for reading these charges.

According to an embodiment, the transfer of the photogenerated charges from the storage potential wells to a device for reading these charges is performed by means of transfer gates formed at the surface of the semiconductor layer.

Another embodiment further provides a device for alternately transferring photogenerated charges in two directions, comprising a semiconductor layer in which are formed at least a first and a second parallel trenches, each trench comprising at least two regions of a conductive material, separated from each other and from the substrate by an insulating material, further comprising means for biasing the regions capable of creating in the space between trenches, in front of certain regions, volume accumulations of holes.

Another embodiment provides a photonic demodulator comprising a photogenerated charge transfer device such as described hereabove, implementing the above method.

The foregoing and other features, and advantages of the present disclosure will be discussed in detail in the following non-limiting description of specific embodiments in connection with the accompanying drawings.

BRIEF DESCRIPTION OF THE SEVERAL VIEWS OF THE DRAWINGS

For clarity, the same elements have been designated with the same reference numerals in the different drawings and, further, as usual in the representation of elementary image sensor cells, the various drawings are not to scale.

DETAILED DESCRIPTION

Figure 2:
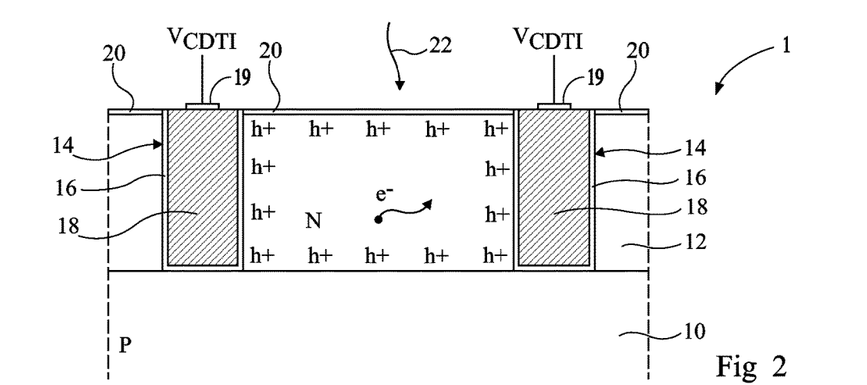
FIG. 2 illustrates a structure of deep biasable trenches forming the basis of a charge transfer system.

FIG. 2 illustrates an integrated structure 1 used in a fast charge transfer device for a three-dimensional image sensor.

At the surface of a P-type doped semiconductor substrate 10 is formed an N-type doped semiconductor layer 12. In semiconductor layer 12 are formed through trenches 14, having their bottoms reaching the surface of semiconductor substrate 10. As a variation, trenches 14 may slightly penetrate into semiconductor substrate 10. Trenches 14 have their walls coated with an insulating material layer 16. The core of each trench 14, in the enclosure formed by insulating material 16, is filled with a conductive material 18. As an example, material 18 may be heavily-doped polysilicon.

Trenches such as trenches 14 shown in FIG. 2 are called CDTI (Capacitive Deep Trench Isolation) in the art. Bias means capable of applying a voltage $V_{CDTI}$ to conductive regions 18 are provided at the surface of these regions. The bias means may for example comprise a voltage source (not shown in FIG. 2) electrically coupled to metal pads 19 formed at the surfaces of conductive regions 18, on which electric contacts are made.

If a negative bias voltage, for example, on the order of −3 V, is applied by the bias means on conductive regions 18, holes (h+) are built up in semiconductor layer 12 along insulating walls 16. Further, due to the doping levels of semiconductor layer 12 and of substrate 10, holes are also accumulated at the interface between the semiconductor layer 12 and the substrate 10. According to an alternative embodiment, a thin lightly-doped P-type layer 20 may also be formed at the surface of semiconductor layer 12. Layer 20 also causes the accumulation of holes h+ at the interface between layer 20 and semiconductor substrate 12.

The accumulation of holes h+ on the contour of the area defined by trenches 14 advantageously enables to avoid the generation of dark current at the interfaces between the insulating material and the semiconductor material.

According to the bias voltage applied to conductive material 18, as well as according to the doping level of level 12, hole accumulation regions of variable thickness form on the contour of semiconductor layer 12 located between two trenches 14. By varying the distance between two opposite trenches 14, the doping level of layer 12, and the bias voltage of trenches 14, portions of semiconductor layer 12 in which a hole volume accumulation fills the space between trenches can thus be obtained. Those skilled in the art will easily determine the distance between trenches, the doping levels and the bias voltages providing such a volume accumulation of holes in portions of semiconductor layer 12. The distance between trenches may for example range between 1 and 3 μm.

When the portion of semiconductor layer 12 located between trenches 14 contains a hole accumulation, if a light beam 22 reaches the surface of semiconductor layer 12 and causes the forming of an electron-hole pair therein, electron e⁻ of this pair is transferred to an area with a lower hole accumulation.

Image sensors capable of detecting three-dimensional images using high-frequency charge transfer devices based on the integrated structure 1 are provided herein.

Figure 9:
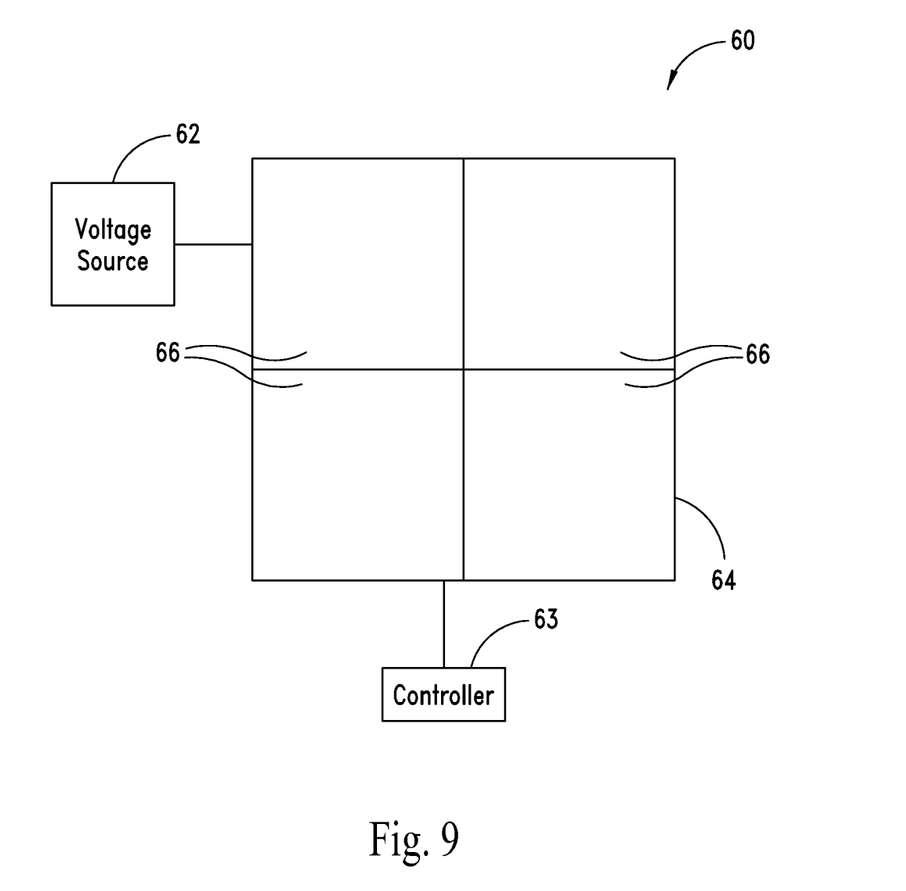
FIG. 9 schematically illustrates a three-dimensional image sensor according to one embodiment of the present disclosure.

An image sensor 60, comprising a voltage source 62, a controller 63, and a pixel array 64, is depicted schematically in FIG. 9. The pixel array includes a plurality of pixels 66 (only four pixels 66 are shown for simplicity, but the pixel array could include any number of pixels). Each pixel includes a device operating at high-frequency, such as the high-frequency charge transfer devices 2A, 2B shown in FIGS. 3-4. In these devices 2A, 2B, photogenerated charges can be alternately sent in two directions, according to the considered acquisition window. The controller 63 is coupled to the pixel array 64 and is configured to control the biasing of the pixels via the voltage source 62 (as discussed in more detail below) and receive and process the detection signals into three-dimensional images.

Figure 5A:
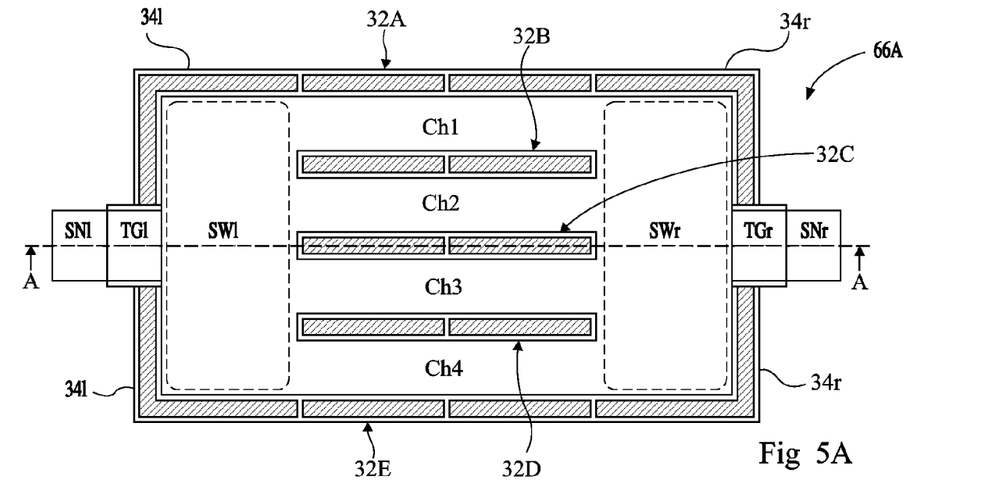
FIGS. 5A to 5B respectively illustrate a top view of a charge storage and transfer device and a curve of the biasing, along an axis A-A in FIG. 5A, of the different portions of the structure of FIG. 5A.
Figure 6:
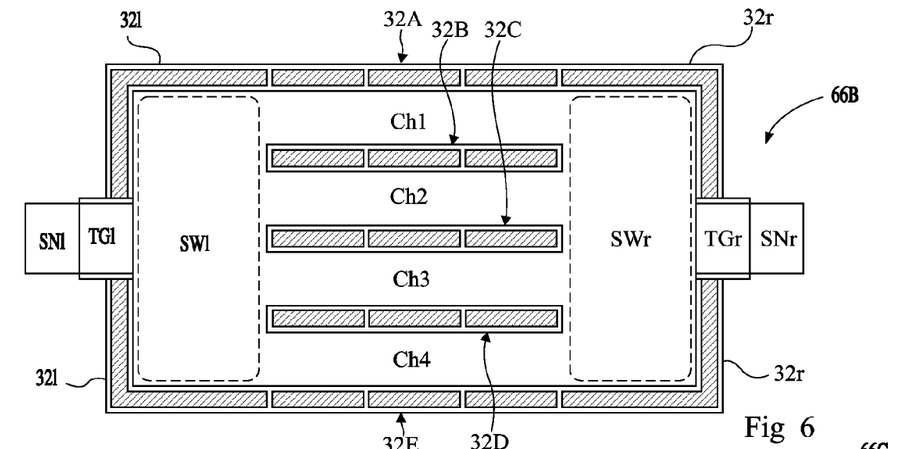
FIG. 6 illustrates, in top view, an alternative embodiment of the structure of FIG. 5A.
Figure 7:
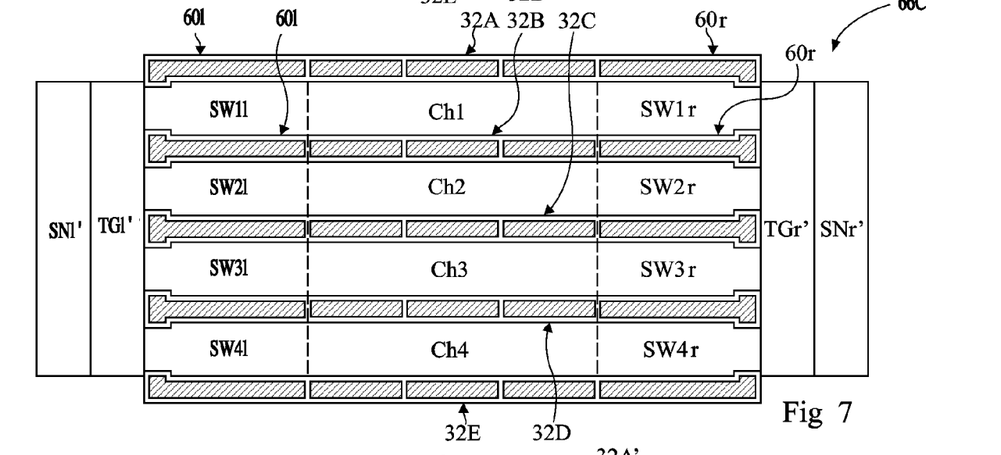
FIG. 7 illustrates, in top view, another alternative embodiment of the structure of FIG. 5A.

According to embodiments shown in FIGS. 5A, 6, and 7, the transferred photogenerated charges are stored in intermediate storage potential wells. The high-frequency charge transfer cycles are repeated a number of times, and the charges stored in the different potential wells are periodically read and exploited by a transfer of these charges to a read node.

Figure 8:
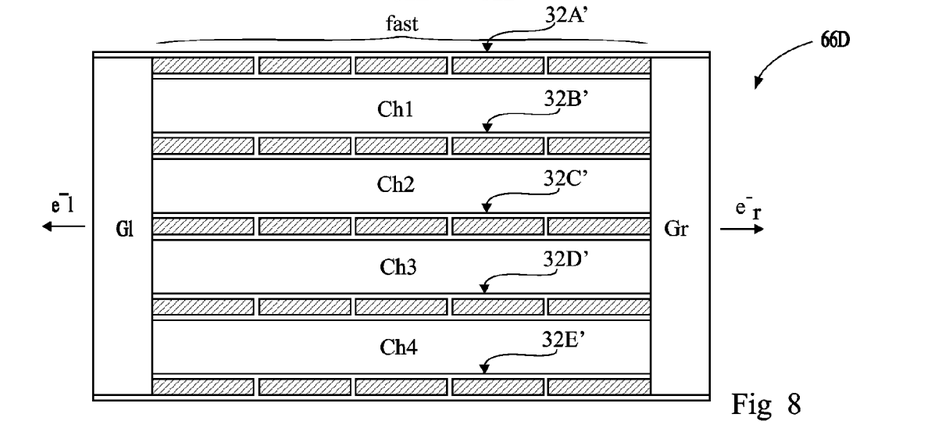
FIG. 8 illustrates a variation of the structure of FIG. 7 comprising no intermediate charge storage well.

According to an embodiment shown in FIG. 8, the charges are transferred continuously, in the different successive read windows and in different directions, to a circuitry capable of obtaining information from the transferred photogenerated charges.

Figure 3:
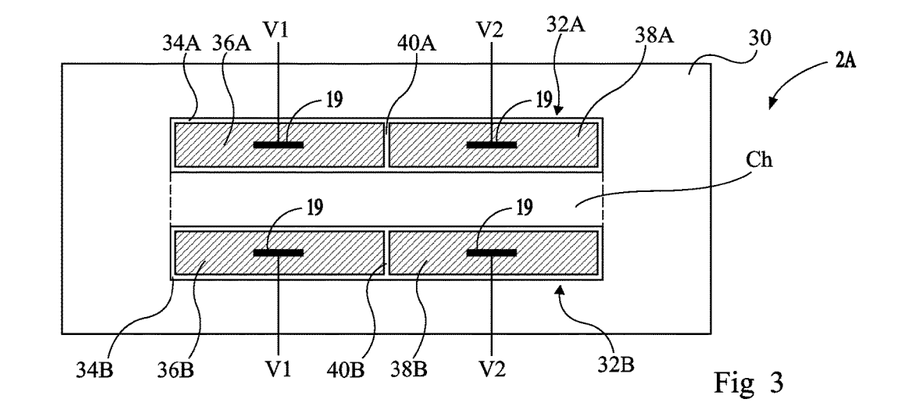
FIG. 3 illustrates, in top view, a charge transfer structure.

FIG. 3 illustrates a high-frequency charge transfer device 2A for alternately transferring photogenerated charge transfer device in two directions. This device takes advantage of the above-discussed properties of deep insulated biasable trenches such as in the device 1 of FIG. 2.

FIG. 3 shows, in top view, a stacking of a semiconductor substrate and of a semiconductor layer 30, only upper semiconductor layer 30 being visible. In layer 30 are formed two parallel trenches 32A and 32B. Trenches 32A and 32B delimit, in semiconductor layer 30, a channel Ch (having its contour illustrated in dotted lines in FIG. 3). The channel area forms the photodetection area of the considered pixel. To avoid for other pixel areas, for example, storage wells SWl, SWr of FIG. 5A, to be impacted by incident light beams, it may be provided to protect these areas from incident beams, for example, by forming an opaque mask at the surface of these areas. Trenches 32A and 32B are symmetrical to each other. Trench 32A, respectively 32B, is insulated from substrate 30 by an insulating material layer 34A, respectively 34B, which covers the bottom and the walls of the trench.

Formed within the trench 32A are two conductive regions 36A and 38A that extend lengthwise along the length of the trench and are separated by an insulating material region 40A that extends vertically in the trench 32A. Symmetrically, formed within the trench 32B are two conductive material regions 36B and 38B that extend lengthwise along the length of the trench 32B and are separated by an insulating material region 40B that extends vertically in the trench 32B. Regions 36A, 38A, 36B, and 38B extend the entire depth of trenches 32A and 32B. Conductive regions 36A, 38A, 36B, and 38B are thus insulated from one another and from substrate 30 by insulating regions 34A, 34B, 40A, and 40B.

Terminals 19 for biasing conductive regions 36A, 38A, 36B, and 38B are provided. Such terminals 19 are electrically coupled to a voltage source, such as the voltage source 62 of FIG. 9, and are capable of biasing opposite regions 36A and 36B to a voltage called V1, and of biasing opposite regions 38A and 38B to a voltage called V2. They may for example be formed of metal connection pads formed at the surface of the conductive regions, at the surface of which an electric contact is formed.

The device 2A of FIG. 3 operates as follows. When the cell of FIG. 3 is illuminated, by a light beam which has reflected from an object in the case of a 3D acquisition, the controller 63 alternately sets voltages V1 and V2 to high and low levels in a charge transfer cycle.

In a first phase of each charge transfer cycle, voltage V1 is set to a low level, as described in relation with FIG. 2, to form a hole accumulation in the area of channel Ch located between two conductive regions 36A and 36B of trenches 32A and 32B. Meanwhile, the voltage V2 is greater than voltage V1. Fewer holes thus accumulate at the periphery of channel area Ch located between regions 38A and 38B. An electric field, capable of transferring electrons photogenerated in channel Ch to the right of channel Ch, is thus created in channel Ch (on the side of the area between regions 38A and 38B).

In a second phase of each charge transfer cycle, the voltages on terminals V1 and V2 are inverted and voltage V2 is provided to be smaller than voltage V1. Voltage V2 is provided to cause a hole accumulation in the area of channel Ch between regions 38A and 38B. The selection of voltages V1 and V2 thus ensures the transfer of the photogenerated electron-hole pairs towards the left-hand portion of channel Ch (on the side of the area between regions 36A and 36B).

By alternately setting voltages V1 and V2 to adapted voltage levels, and following the rate of the predetermined read windows, the photogenerated electrons are alternately transferred to either side of channel Ch. Advantageously, due to the access times in low biasing mode on conductive regions 36A, 36B, 38A, and 38B, the alternated operation of the device of the cell of FIG. 3 may be performed at very high frequency, for example, at frequencies greater than one gigahertz. Detecting the quantity of electrons transferred on either side of channel Ch in a cycle of biasing of conductive regions 36A, 38A, 36B, and 38B, enables to obtain the information relative to the distance of an object detected by the cell of FIG. 3. Several structures enabling to analyze this quantity of electrons will be discussed hereafter in relation with FIGS. 5A, 5B, 6, 7, and 8.

Those skilled in the art will easily determine optimized values of the voltages alternately applied on the conductive regions to obtain a high demodulation frequency, while providing as low a dark current as possible.

Figure 4:
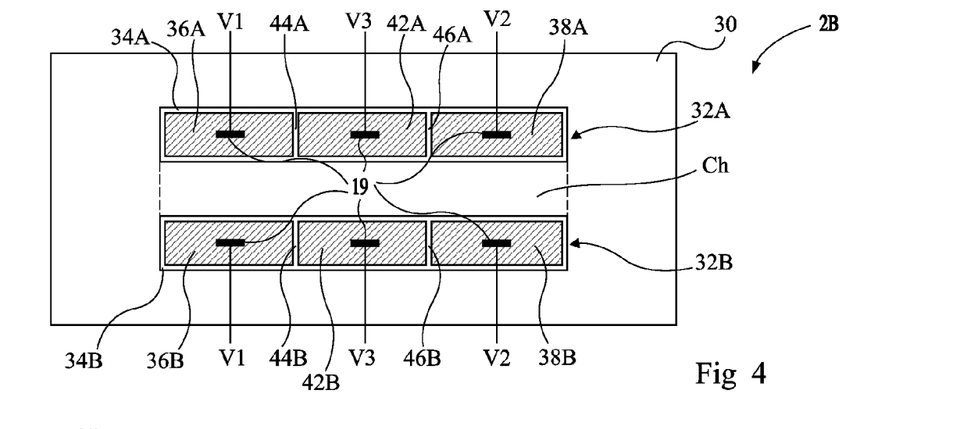
FIG. 4 illustrates, in top view, an alternative embodiment of the structure of FIG. 3.

FIG. 4 illustrates a variation of the structure of FIG. 3, enabling to transfer the photogenerated charges by using a lower amount of supply power than the device of FIG. 3.

The 2B device of FIG. 4 differs from the device 2A of FIG. 3 in that trenches 32A and 32B, instead of comprising two insulated conductive regions lengthwise, comprise three conductive regions 36A, 42A, and 38A in trench 32A, and 36B, 42B, and 38B in trench 32B. Regions 36A, 42A, 38A, 36B, 42B, and 38B extend the entire depth of the associated trenches. Conductive regions 36A and 42A, respectively 36B and 42B, are separated by an insulating material 44A, respectively 44B, and conductive regions 42A and 38A, respectively 42B and 38B, are separated by an insulating material 46A, respectively 46B.

Bias terminals 19, under control of the controller 63 of FIG. 9, are provided to bias to a first voltage V1 opposite conductive regions 36A and 36B, to bias to a bias voltage V2 conductive regions 38A and 38B, and to bias to a bias voltage V3 conductive regions 42A and 42B.

The device 2B of FIG. 4 operates similarly to the device 2A of FIG. 3. It is provided to alternately apply voltages V1 and V2 at high levels and at low levels so that, alternately, the channel areas in semiconductor layer 30 located in front of these regions are filled with a hole accumulation or only surrounded with holes, to form an electric field which alternately pushes the photogenerated electrons in two opposite directions of channel Ch.

The difference with respect to the operation of FIG. 3 is that voltage V3 ranges between the two voltages alternately applied to terminals V1 and V2. In operation, voltage V3 does not vary, which provides a central area of channel Ch having a set operation during the alternated application of high and low voltages on the conductive regions controlled by voltages V1 and V2. The use of central regions 42A and 42B having a voltage which does not vary advantageously enables to decrease the high-frequency switched capacitance and thus to decrease the device consumption.

Advantageously, the use of deep CDTI-type biasable trenches for trenches 32A and 32B of FIGS. 3 and 4 enables to efficiently transfer the photogenerated charges. Indeed, at the considered wavelengths, for example, ranging between 750 and 950 µm, photogenerated electrons may be formed deep in semiconductor layer 30. The forming of deep trenches, and the electron transfer across the entire depth of these trenches, provides a very short travel time of the electrons towards areas of detection of these electrons, shorter than in cases where the charge transfer is performed at the surface of substrate 30 only. Indeed, in the structures of FIGS. 3 and 4, the electrons are transferred horizontally and no time loss due to a vertical transfer of the electrons is implied.

The electron transfer time is thus optimized on either side of channel Ch. Further, advantageously, the forming of a deep biased trench insulated from the substrate enables to decrease dark currents generated on the trench contour.

It should be noted that, due to the considered frequencies, only small quantities of photogenerated electrons are transferred at each cycle on either side of channel Ch. At such frequencies, only a few tens of electrons are transferred at each cycle. Thus, one should decrease as much as possible parasitic effects of the integrated systems provided herein, to obtain an advantageous detection. The structures provided in FIGS. 3 and 4 provides such an efficiency. It should be noted that the structures of FIG. 3 or 4 may be alternately used in the different variations described hereinafter.

Figure 5B:
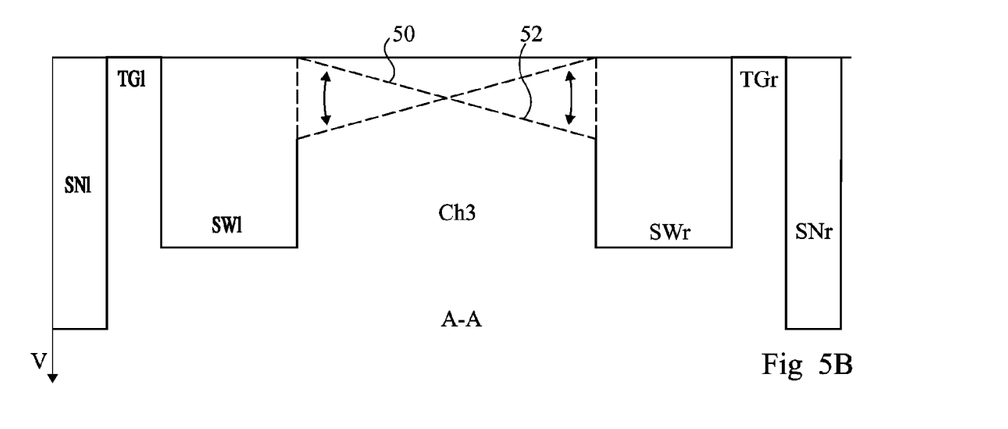

FIGS. 5A and 5B illustrate a complete device 66A for alternately detecting, transferring, and reading photogenerated charges in two directions. More specifically, FIG. 5A is a top view of such a device and FIG. 5B is a curve of the biasing levels along a line A-A in FIG. 5A. The device 66A of FIG. 5A could be used as the pixels 66 of the imaging device 60 of FIG. 9.

In the example of FIG. 5A, several channels Ch1 to Ch4 such as channel Ch of FIGS. 3 and 4 are formed in parallel. The channels are separated by insulated trenches such as trenches 32A and 32B of FIG. 3. Such separation trenches are called 32A, 32B, 32C, 32D, and 32E in FIG. 5A and in the following drawings. Each trench comprises several conductive regions (hatched), biasable as described in relation with FIGS. 3 and 4. For the clarity of the drawing, these regions bear no reference numerals in FIG. 5A and in the following drawings.

On either side of channels Ch1 to Ch4 are formed, in semiconductor layer 30, a storage potential well SWl (to the left in the drawing) and a storage well SWr (to the right in the drawing). Storage wells SWl and SWr enable to collect the charges transferred by the fast alternated charge transfer device formed of channel Ch and of trenches 32A to 32E. Storage wells SWl and SWr are delimited by insulating trenches 34*l* in the left-hand portion of the structure and 34*r* in the right-hand portion of the structure. Insulating trenches 34*l* and 34*r* preferably are deep insulated trenches of the same type as trenches 32A to 32E, biased to a voltage capable of creating a slight hole accumulation on the trench walls.

To form charge storage wells SWl and SWr, it may for example be provided for storage wells SWl and SWr to be formed of respective regions of heavily-doped N-type layer 30. The conductive regions forming trenches 34A and 34E are alternately biased in the way described in relation with FIG. 3.

Charge transfer gates TGl and TGr, respectively provided in interrupted areas in trenches 34*l* and 34*r*, enable to transfer all the charges stored in storage nodes SWl and SWr. A read node SNl, respectively SNr, is formed opposite to area SWl, respectively SWr, with respect to transfer gate TGl, respectively TGr. Read nodes SNl and SNr are formed of doping areas capable of having a high voltage and of capturing the transferred electrons.

As shown in FIG. 5B, transfer gates TGl and TGr form, when blocked, potential barriers on either side of charge storage wells SWl and SWr. As shown in dotted lines in FIG. 5B, the action on the conductive regions of trenches 32A to 32E, alternately biased, enables to create alternated voltage slopes 50 and 52 which alternately direct the photogenerated electrons into storage nodes SWl and SWr.

For each cycle of biasing of the conductive regions of trenches 32A to 32E, a first quantity of electrons is transferred and stored in storage well SWl during the first phase of each cycle, and a second quantity of electrons is transferred and stored in storage node SWr in the last phase of each cycle. Bias cycles according to curves 50 and 52 are repeated a greater number of times, for example, a few tens of thousands of times, before all the charges stored in storage wells SWl and SWr are transferred into read nodes SNl and SNr by transfer gates TGl and TGr. The reading then performed from read nodes SNl and SNr provides the information relative to the distance to objects.

The device 66A of FIG. 5A thus comprises a central high-frequency portion and a portion for transferring the photogenerated and stored charges (formed of storage wells SWl and SWr, of transfer gates TGl and TGr, and of read nodes SNl and SNr) operating identically to a standard pixel with four transistors (4T) (at conventional acquisition frequencies, for example, on the order of 30 images per second). Advantage is thus taken of the rapidity of the transfer performed by means of the alternated biasing of the conductive regions of trenches 32A to 32E while enabling to transfer electrons stored in storage wells SWl and SWr within a reasonable time period.

FIG. 6 illustrates a device 66B according to an alternative embodiment, where trenches 32A to 32E are not formed of two conductive regions as is the case in FIG. 5A, but of three adjacent conductive regions as shown in FIG. 4. The operation of this device 66B is identical to that of FIG. 5A, in relation with the alternated biasing discussed in relation with FIG. 4. As with the device 66A, the device 66B can be used to implement the pixels 66 of the image sensor of FIG. 9.

FIG. 7 illustrates a device 66C according to an alternative embodiment in which channels Ch1 and Ch4 do not have their ends arriving in a single common storage potential well (SWl or SWr), on either side of the channels, but each channel Ch1 to Ch4 extends in a storage well, SW1*l* to SW4*l* in the left-hand portion of channels Ch1, Ch4 and SW1*r* to SW4*r* in the right-hand portion of channels Ch1 and Ch4. As with the devices 66A and 66B, the device 66C can be used to implement the pixels 66 of the image sensor of FIG. 9.

In this embodiment, storage wells SW1*l* to SW4*l* and SW1*r* to SW4*r* are insulated from one another by biasable insulating trenches 60*l* and 60*r*. The bias voltage applied on insulating trenches 60*l* and 60*r* is adapted, with the doping level of wells SW1*l* to SW4*l* and SW1*r* to SW4*r*, to forming storage wells on either side of channels Ch1 to Ch4.

To transfer the charges accumulated in the different cycles in potential wells SW1*l* to SW4*l* and SW1*r* to SW4*r* , wide transfer gates (called TGl' to the left of the channels and TGr' to the right of the channels) formed to be able to transfer the charges of the different potential wells, that is, in front of areas SW1*l* to SW4*l* and SW1*r* to SW4*r*, are formed on either side of the device. Read nodes SNl' and SNr' are formed on either side, respectively, of transfer gates TGl' and TGr'. As a variation, wide transfer gates TGl' and TGr' may be replaced with several transfer gates formed at the end of the storage wells.

The device 66C of FIG. 7 operates in the same way as the devices 66A, 66B of FIGS. 5 and 6: electrons photogenerated in the different channels Ch1 and Ch4 are alternately transferred into potential wells SW1l to SW4l and SW1r to SW4r. In a subsequent read phase, transfer gates TGl' and TGr' are made conductive to transfer the charges stored in the different potential wells SW1l to SW4l and SW1r to SW4r towards associated read nodes SNl' and SNr'.

Advantageously, the structures of FIGS. 5A, 6, and 7 avoid the forming of reset noise (known as "kTC" noise) which occurs in conventional image sensors. Indeed, a structure in which an intermediate storage well directly receives the photogenerated electrons is here formed. The electrons are then only transferred by the transfer gates to read nodes. An insulation is thus created between the read node and the charge photogeneration and storage circuit, which strongly limits spurious noise. The structures of FIGS. 5A, 6, and 7 thus operate in voltage mode, after a phase of charge integration in the intermediary storage wells.

FIG. 8 illustrates an alternative device 66D that can be used to implement one of the pixels 66 of the image sensor 60 using the same fast alternated transfer structure as the devices of FIGS. 3 to 7, but comprising no intermediate charge storage well.

In the device 66D of FIG. 8, channels Ch1 and Ch4 are delimited, lengthwise, by an assembly of insulated trenches 32A' to 32E' of the same type as those described in relation with FIGS. 3 and 4. Insulated trenches 32A' to 32E' may comprise, lengthwise, several conductive regions insulated from one another and from substrate 30. In the device 66D of FIG. 8, five conductive regions insulated from one another are shown, and ensure the transfer of the electrons photogenerated at the level of channels Ch1 and Ch4 alternately on either side of these channels.

At the end of channels Ch1 to Ch4, transfer gates, Gl to the left of the structure and Gr to the right of the structure, are alternately made conductive at high frequency, simultaneously to the conveying of the photogenerated electrons on either side of channels Ch1 and Ch4. Thus, for each cycle, electrons photogenerated in channels Ch1 to Ch4 are conveyed, in a first phase, to the left of the channels via transfer gate Gl and, in a second phase of each cycle, the photogenerated charges are conveyed by the structure towards the right of the channels by transfer gate Gr.

In this embodiment, the alternated electron flows are directly processed. The electronic circuit enabling to process the information generated by the alternated high-frequency electron flows on either side of gates Gl and Gr (flow $e^-_l$ to the left of gate Gl and $e^-_r$ to the right of gate Gr) has not been shown herein. Those skilled in the art will easily determine the circuitry capable of processing the information contained in such electron flows (the structure 66D of FIG. 8 operates in current mode, conversely to the structures 66A-66C of FIGS. 5A, 6, and 7 which operate in voltage mode).

Further, charge transfer gates Gl and Gr may be formed of an assembly of individual gates formed at the ends of each channel Ch1 to Ch4 and controlled simultaneously rather than of a single common gate.

As an example, the information relative to the distance to a detected object may be obtained by comparing the amount of current generated by the electrons in the two transfer phases of each cycle.

As a numerical example of application, a spacing between trenches ranging between 1 and 3 μm may be provided for a proper operation of the devices described herein, the trenches and upper semiconductor layer 30 having a depth ranging between 3 and 5 μm. By selecting the doping levels of semiconductor layer 30 in adapted fashion, those skilled in the art will easily obtain the above operation.

Specific embodiments of the present disclosure have been described. Various alterations, modifications, and improvements will occur to those skilled in the art. In particular, it should be noted that the insulated trenches comprising several conductive regions discussed in the different embodiments of this description may comprise a variable number of conductive regions. It should be noted that, following the example of FIG. 3, some of these conductive portions may be biased to a fixed voltage while others may be biased to alternately-varying voltages. Several intermediate bias levels (fixed or not) may also be applied to the different conductive regions.

Further, devices in which the charge transfer channels are capable of alternately transferring photogenerated electrons in two opposite directions have been disclosed herein. It should be noted that different channel shapes, not necessarily straight, may also be provided, the electrons being then transferred in directions which are not opposite to each other.

Various embodiments with different variations have been described hereabove. It should be noted that those skilled in the art may combine various elements of these various embodiments and variations without showing any inventive step.

In particular, the transfer of electrons photogenerated in an upper N-type doped semiconductor region, by the forming of hole accumulation areas in channels Ch1 to Ch4, has been discussed herein. It should be noted that a similar operation may also be provided by using an upper P-type doped semiconductor layer, the bias voltages being then adapted to forming, in the channels defined in this layer, a volume accumulation of electrons. This accumulation is provided so that photogenerated holes are alternately transferred on either side of the channels, to be processed by appropriate read devices.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
  transferring charges photogenerated in a first portion of a semiconductor layer delimited by first and second trenches, the first and second trenches being capacitive deep trench isolation trenches separated from each other by the first portion of the semiconductor layer, each trench being surrounded by an insulating material separating the trench from the semiconductor layer and including first and second conductive regions filling the trench, each conductive region being surrounded by the insulating material separating the conductive region from the other conductive region in the trench, the conductive regions of each trench being positioned horizontally side-by-side in the trench in a plane of the semiconductor layer, the transferring including:
transferring first photogenerated charges in a first direction by biasing the first conductive regions to a first voltage while biasing the second conductive regions to a second voltage greater than the first voltage.

2. The method of claim 1, comprising transferring second photogenerated charges in a second direction by biasing the first conductive regions to the second voltage while biasing the second conductive regions to the first voltage.

3. The method of claim 2, comprising repeatedly and alternately transferring photogenerated charges in the first direction, by biasing the first conductive regions to the first voltage while biasing the second conductive regions to the second voltage, and transferring photogenerated charges in the second direction by biasing the first conductive regions to the second voltage while biasing the second conductive regions to the first voltage.

4. The method of claim 3, wherein each trench comprises an intermediate conductive region and the method includes biasing each intermediate conductive region to a constant third voltage, between the first and the second voltage, while transferring photogenerated charges in the first direction and while transferring photogenerated charges in the second direction, the intermediate conductive region of each trench being surrounded by an insulating material separating the intermediate conductive region from the first and second conductive regions in the trench.

5. The method of claim 2, comprising:
making conductive a first transfer gate, located adjacent to an end of the second conductive region while transferring the first photogenerated charges in the first direction; and
making conductive a second transfer gate, located adjacent to an end of the first conductive region while transferring the second photogenerated charges in the second direction.

6. The method of claim 2, wherein:
transferring the first photogenerated charges in the first direction includes transferring the first photogenerated charges towards a first storage potential well located adjacent to ends of the second conductive regions; and
transferring the second photogenerated charges in the second direction includes transferring the second photogenerated charges towards a second storage potential well located adjacent to ends of the first conductive regions.

7. The method of claim 6, comprising transferring charges photogenerated in a second portion of a semiconductor layer delimited by the first trench and a third trench, the first and third trenches being separated from each other by the second portion of the semiconductor layer, the third trench being surrounded by an insulating material separating the third trench from the semiconductor layer and including first and second conductive regions, each conductive region being surrounded by an insulating material separating the conductive region from the other conductive region in the third trench the transferring charges photogenerated in the second portion including:
transferring photogenerated charges to the first storage potential well, which extends adjacent to an end of the second conductive region of the third trench, by biasing the first conductive regions of the first and third trenches to the first voltage while biasing the second conductive regions of the first and third trenches to the second voltage; and
transferring photogenerated charges to the second storage potential well, which extends adjacent to an end of the first conductive region of the third trench, by biasing the first conductive regions of the first and third trenches to the second voltage while biasing the second conductive regions of the first and third trenches to the first voltage.

8. The method of claim 6, comprising transferring charges photogenerated in a second portion of a semiconductor layer delimited by the first trench and a third trench, the first and third trenches being separated from each other by the second portion of the semiconductor layer, the third trench being surrounded by an insulating material separating the third trench from the semiconductor layer and including first and second conductive regions, each conductive region being surrounded by an insulating material separating the conductive region from the other conductive region in the third trench, the transferring charges photogenerated in the second portion including:
transferring photogenerated charges to a third storage potential well located adjacent to ends of the second conductive regions of the first and third trenches; and
transferring photogenerated charges to a fourth storage potential well located adjacent to ends of the first conductive regions of the first and third trenches.

9. The method of claim 6, comprising:
repeatedly and alternately transferring photogenerated charges in the first direction, by biasing the first conductive regions to the first voltage while biasing the second conductive regions to the second voltage, and transferring photogenerated charges in the second direction by biasing the first conductive regions to the second voltage while biasing the second conductive regions to the first voltage; and
transferring, after repeatedly and alternately transferring photogenerated charges in the first direction and the second direction, the charges in the first and second storage potential wells to a reading device configured to read the charges in the first and second storage potential wells.

10. The method of claim 9, wherein transferring the photogenerated charges from the storage potential wells to the reading device is performed using transfer gates formed at a surface of the semiconductor layer.

11. The method of claim 1 wherein each trench has a length and a width, the length being greater than the width, the first and second conductive regions running along respective portions of the length of the respective trench with the insulating material in the respective trench separating the first and second conductive regions and with both the first and second conductive regions being adjacent to and separated from the first portion of the semiconductor layer by insulating material running along the length of the respective trench.

12. A photonic device, comprising:
a semiconductor layer having first and second trenches separated by a first area of the semiconductor layer, each trench being a capacitive deep trench isolation trench having an insulating material surrounding the trench in the semiconductor layer and separating the trench from the semiconductor layer;
first and second conductive regions surrounded by the insulating material in the first trench, the insulating material in the first trench separating the first and second conductive regions from each other in the first trench, the first and second conductive regions filling the first trench and positioned horizontally side-by-side in the first trench in a plane of the semiconductor layer;

third and fourth conductive regions surrounded by the insulating material in the second trench, the insulating material in the second trench separating the third and fourth conductive regions from each other in the second trench, the third and fourth conductive regions filling the second trench and positioned horizontally side-by-side in the second trench in the plane of the semiconductor layer;

first, second, third, and fourth biasing terminals electrically coupled respectively to said first, second third, and fourth conductive regions; and a controller, which, in operation, controls transferring of photogenerated charges in the first area by controlling electrical biasing of the conductive regions via the biasing terminals.

13. The device of claim 12 wherein the controller is configured to control creating, in the first area, volume accumulations of holes by controlling electrical biasing of the conductive regions via the respective first, second, third, and fourth biasing terminals.

14. The device of claim 12 wherein the controller is configured to:
control transferring first photogenerated charges in the first area in a first direction by controlling biasing the first and third conductive regions to a first voltage while controlling biasing the second and fourth conductive regions to a second voltage greater than the first voltage; and
control transferring second photogenerated charges in the first area in second direction by controlling biasing the first and third conductive regions to the second voltage while controlling biasing the second and fourth conductive regions to the first voltage.

15. The device of claim 14, comprising:
a first intermediate conductive region positioned in the first trench between the first and second conductive regions and surrounded and separated from the first and second conductive regions and from the semiconductor layer by the insulating material in the first trench; and
a second intermediate conductive region positioned in the second trench between the third and fourth conductive regions and surrounded and separated from the third and fourth conductive regions and from the semiconductor layer by the insulating material in the second trench, wherein the controller is configured to bias the intermediate conductive regions to a constant third voltage between the first and second voltages while controlling transferring the first photogenerated charges and while control transferring the second photogenerated charges.

16. The device of claim 14, comprising:
a first transfer gate located adjacent to end of the second and fourth conductive regions, the first transfer gate being configured to receive the first photogenerated charges from the first area and provide a first output signal based on the first photogenerated charges; and
a second transfer gate located adjacent to ends of the first and third conductive regions, the second transfer gate being configured to receive the second photogenerated charges from the first area and provide a second output signal based on the second photogenerated charges.

17. The device of claim 14, comprising:
a first storage potential well located adjacent to ends of the second and fourth conductive regions, the first storage potential well being configured to store the first photogenerated charges from the first area; and
a second storage potential well located adjacent to ends of the first and third conductive regions, the second storage potential well being configured to store the second photogenerated charges from the first area.

18. The device of claim 17, wherein the semiconductor layer includes a third trench, the device comprising:
an insulating material in the third trench surrounding and separating the third trench from the semiconductor layer; and
fifth and sixth conductive regions surrounded by the insulating material in the third trench, the insulating material in the third trench separating the fifth and sixth conductive regions separated from each other in the third trench, the first storage potential well extending adjacent to the sixth conductive region and the second storage potential well extending adjacent to the fifth conductive region.

19. The device of claim 14, wherein the semiconductor layer includes a third trench, the device comprising:
an insulating material in the third trench surrounding and separating the third trench from the semiconductor layer;
fifth and sixth conductive regions surrounded by the insulating material in the third trench, the insulating material in the third trench separating the fifth and sixth conductive regions from each other in the third trench;
a third storage potential well located adjacent to ends of the second and sixth conductive regions; and
a fourth storage potential well located adjacent to ends of the first and fifth conductive regions.

20. The device of claim 12 wherein the first conductive region is in a first portion of a length of the first trench adjacent to the first area and the second conductive region is in a second portion of the length of the first trench adjacent to the first area.

21. An image sensor, comprising:
a plurality of photonic devices, each photonic device including:
a semiconductor layer having first and second trenches separated by a first area of the semiconductor layer, the first and second trenches being capacitive deep trench isolation trenches;
a first insulating material in the first trench surrounding and separating the first trench from the semiconductor layer;
a second insulating material in the second trench surrounding and separating the second trench from the semiconductor layer;
first and second conductive regions filling the first trench, the first insulating material surrounding and separating the first and second conductive regions from each other in the first trench, the first and second conductive regions positioned horizontally side-by-side in the first trench in a plane of the semiconductor layer with both the first and second conductive regions being adjacent to and separated from the first area of the semiconductor layer by a portion of the first insulating material running along a length of the first trench adjacent to the first area;
third and fourth conductive regions filling the second trench, the second insulating material surrounding and separating the third and fourth conductive regions from each other in the second trench, the third and fourth conductive regions positioned horizontally side-by-side in the second trench in the plane of the semiconductor layer with both the third and fourth conductive regions being adjacent to and separated from the first area of the semiconductor layer by a portion of the second insulating material running along a length of the second trench adjacent to the first area; and first, second, third, and fourth biasing terminals electrically coupled respectively to said first, second third, and fourth conductive regions, wherein, in operation, electrical biasing of the conductive regions via the biasing terminals controls transfer of photo-generated charges in the first area.

22. The image sensor of claim 21, comprising:
a controller configured to control each photonic device by creating, in the first area of the photonic device, volume accumulations of holes by controlling electrical biasing of the conductive regions of the photonic device via the respective first, second, third, and fourth biasing terminals of the photonic device.

23. The image sensor of claim 22, wherein, for each photonic device, the controller is configured to:
control transferring first photogenerated charges in the first area of the photonic device in a first direction by controlling biasing the first and third conductive regions of the photonic device to a first voltage while controlling biasing the second and fourth conductive regions of the photonic device to a second voltage greater than the first voltage; and
control transferring second photogenerated charges in the first area of the photonic device in second direction by controlling biasing the first and third conductive regions of the photonic device to the second voltage while controlling biasing the second and fourth conductive regions of the photonic device to the first voltage.

24. The image sensor of claim 21 wherein,
the first trench has a length and a width, the length being greater than the width; and
the first and second conductive regions are positioned lengthwise in the first trench with a portion of the first insulating material separating the first and second conductive regions.

25. A photonic device, comprising:
a semiconductor layer;
a plurality of trenches in the semiconductor layer, each of the plurality of trenches being a capacitive deep trench isolation trench spaced apart from other trenches of the plurality of trenches in the semiconductor layer and including a plurality of conductive regions filling the trench, each trench of the plurality of trenches having an insulating material separating the respective trench from the semiconductor layer and separating the plurality of conductive regions in the respective trench from each other, with the plurality of conductive regions in the respective trench positioned horizontally side-by-side in a plane of the semiconductor layer; and
a plurality of biasing terminals electrically coupled to respective conductive regions of the plurality of plurality of trenches, wherein, in operation, electrical biasing of the conductive regions via the biasing terminals controls transfer of photo-generated charges in the semiconductor layer.

26. The photonic device of claim 25 wherein the each of the plurality of conductive regions of a respective trench are adjacent to and separated from a portion of the semiconductor layer by insulating material running along the length of the respective trench.

27. The photonic device of claim 25 wherein the plurality of trenches is two trenches and each trench has three conductive regions.

28. The device of claim 25, comprising:
a controller configured to control creating, in an area of the semiconductor layer separating two trenches of the plurality of trenches, volume accumulations of holes by controlling electrical biasing of the conductive regions of the two trenches via biasing terminals of the plurality of biasing terminals coupled to respective conductive regions of the two trenches.

* * * * *